(12) United States Patent
Nobunaga et al.

(10) Patent No.: US 10,832,751 B2
(45) Date of Patent: Nov. 10, 2020

(54) MAGNETIC MEMORY AND METHOD FOR USING THE SAME

(71) Applicant: Avalanche Technology, Inc., Fremont, CA (US)

(72) Inventors: Dean K. Nobunaga, Cupertino, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 16/176,292

(22) Filed: Oct. 31, 2018

(65) Prior Publication Data

US 2020/0135250 A1   Apr. 30, 2020

(51) Int. Cl.
*G11C 13/00* (2006.01)
*G11C 11/16* (2006.01)
*G11C 11/00* (2006.01)

(52) U.S. Cl.
CPC ........ *G11C 11/1659* (2013.01); *G11C 11/161* (2013.01); *G11C 11/1697* (2013.01); *G11C 11/00* (2013.01); *G11C 11/1675* (2013.01)

(58) Field of Classification Search
CPC .................................................. G11C 13/0097

USPC ........................ 365/158, 175, 185.21, 189.05
See application file for complete search history.

(56) References Cited

U.S. PATENT DOCUMENTS

| 8,824,190 B1 | 9/2014 | Kim et al. |
| 9,058,852 B2 | 6/2015 | Kim et al. |
| 2010/0097852 A1 | 4/2010 | Chen et al. |
| 2014/0104925 A1 | 4/2014 | Azuma et al. |
| 2016/0027510 A1* | 1/2016 | Lee .................... G11C 13/0033 365/148 |

* cited by examiner

*Primary Examiner* — Jason Lappas
(74) *Attorney, Agent, or Firm* — Bing K. Yen

(57) ABSTRACT

The present invention is directed to a memory circuitry that includes a magnetic memory element and a selector coupled in series between a first conductive line and a second conductive line; a current detector coupled to the second conductive line; and a means for supplying a sufficiently high voltage to the first conductive line for turning on the selector. When the selector turns on, the current detector detects a current flowing across the selector and effectuates a current limiter to reduce the current while maintaining the selector on. The memory circuitry may be operated by applying a sufficiently high voltage to the first conductive line for turning on the selector; reducing a current flowing through the selector while maintaining the sufficiently high voltage on the first conductive line; and determining a resistance state of the magnetic memory element.

14 Claims, 11 Drawing Sheets

MAGNETIC MEMORY AND METHOD FOR USING THE SAME

BACKGROUND

The present invention relates to a magnetic memory, and more particularly, to embodiments of a circuitry for an array of magnetic memory cells and method for using the same.

A resistance-based memory device normally comprises an array of memory cells, each of which includes a memory element and a selection element, such as transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram of a memory array 20, which comprises a plurality of memory cells 22 with each of the memory cells 22 including an access transistor 24 coupled to a resistance-based memory element 26; a plurality of parallel word lines 28 with each being coupled to the gates of a respective row of the access transistors 24 in a first direction; a plurality of parallel bit lines 30 with each being coupled to a respective row of the memory elements 26 in a second direction substantially perpendicular to the first direction; and a plurality of parallel source lines 32 with each being coupled to a respective row of the access transistors 24 in the first or second direction.

Alternatively, the access transistors 24 of the memory cells 22 may be replaced by two-terminal bi-directional selectors to simplify the wiring scheme and allow stacking of multiple levels of memory arrays. FIG. 2 is a schematic circuit diagram of a memory array 40 incorporating therein two-terminal selectors as selection elements. The memory array 40 comprises a plurality of memory cells 42 with each of the memory cells 42 including a two-terminal bi-directional selector 44 coupled to a resistance-based memory element 46 in series; a plurality of first conductive lines 48A-48C with each being coupled to a respective row of the memory elements 46 in a first direction; and a plurality of second conductive lines 50A-50C with each being coupled to a respective row of the two-terminal selectors 44 in a second direction substantially perpendicular to the first direction. Accordingly, the memory cells 42 are located at the cross points between the first and second conductive lines 48A-48C and 50A-50C. The first and second conductive lines 48A-48C and 50A-50C may be bit lines and word lines, respectively, or vice versa. Multiple layers of the memory array 40 may be stacked on a wafer substrate to form a monolithic three-dimensional memory device.

The resistance-based memory elements 26 and 46 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current or voltage to the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the two stable resistance states enable the MTJ to serve as a non-volatile memory element.

While the use of two-terminal selectors as selection elements, as shown in FIG. 2, allows the memory array to be more compact and dense, two-terminal selectors in general have inferior performance, such as higher current leakage, longer switching time, and finite switching life, compared with transistors. For the foregoing reason, there is a need for a circuitry that can improve the performance and reliability of a memory array that utilizes two-terminal selectors as selection elements.

SUMMARY

The present invention is directed to a memory circuitry that satisfies this need. A memory circuitry having features of the present invention comprises a magnetic memory element and a selector coupled in series between a first conductive line and a second conductive line; a current detector coupled to the second conductive line; and a means for supplying a sufficiently high voltage to the first conductive line for turning on the selector. When the selector turns on, the current detector detects a current flowing across the selector and effectuates a current limiter to reduce the current while maintaining the selector on.

According to another aspect of the present invention, the memory circuitry is operated by applying a sufficiently high voltage to the first conductive line for turning on the selector; reducing a current flowing through the selector while maintaining the sufficiently high voltage on the first conductive line; and determining a resistance state of the magnetic memory element after reducing the current. The operation may further include the step of switching the resistance state of the magnetic memory element by maintaining the sufficiently high voltage on the first conductive line without limiting the current after determining the resistance state of the magnetic memory element.

According to still another aspect of the present invention, the memory circuitry is operated by applying a sufficiently high voltage to the first conductive line for turning on the selector and switching a resistance state of the magnetic memory element; reducing a current flowing through the selector while maintaining the sufficiently high voltage on the first conductive line after switching the resistance state of the magnetic memory element; and determining the resistance state of the magnetic memory element after reducing the current.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 3:
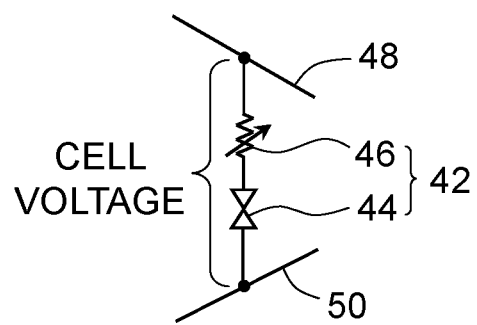
FIG. 3 is an I-V response plot for a memory cell, which includes a magnetic memory element and a selector coupled in series, when the magnetic memory element is in different resistance regimes.
Figure 3:
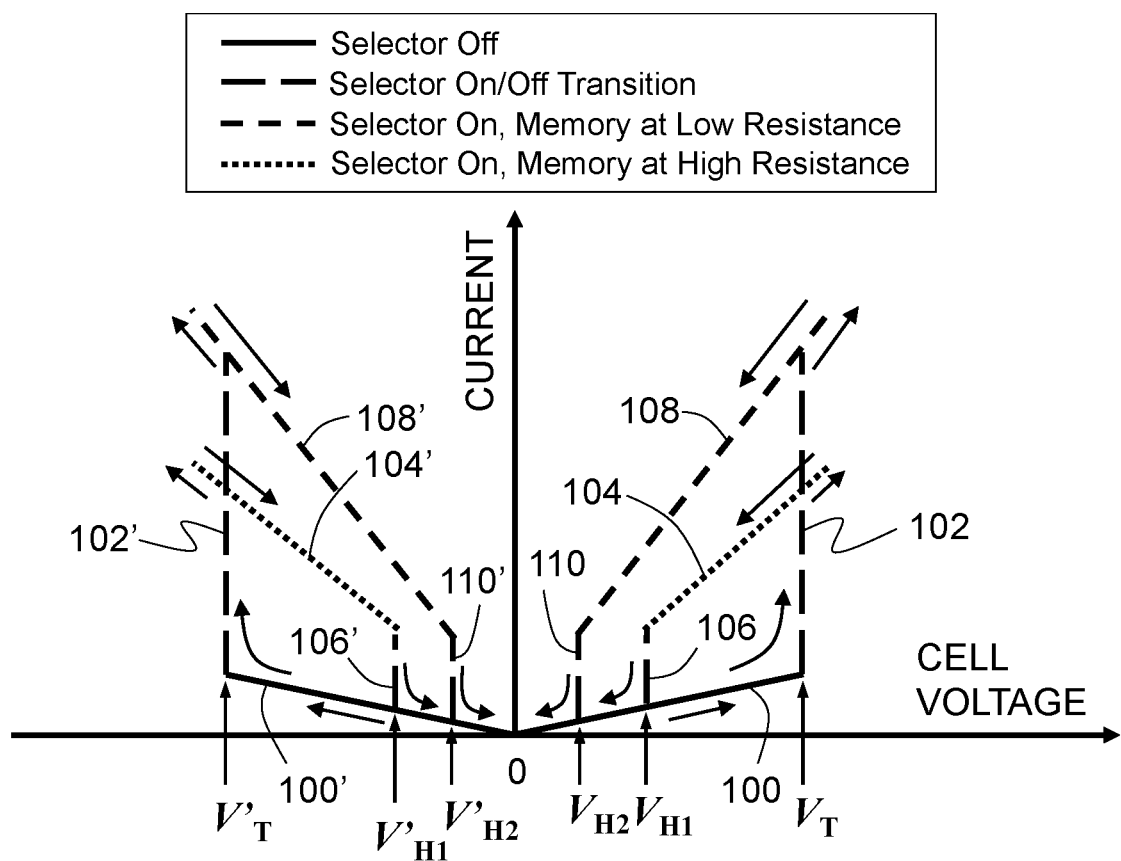

FIG. 3 shows a schematic circuit diagram for an exemplary magnetic memory cell 42, which includes the selector 44 and the magnetic memory element 46 coupled in series between the first conductive line 48 and the second conductive line 50, and the corresponding current-voltage (I-V) response plot. As the cell voltage, which is the sum of the selector voltage and the memory element voltage, increases to near a threshold voltage $V_T$, the current slightly increases and the selector 44 remains substantially insulative or in the off-state, characterized by a curve 100. At or near the threshold voltage $V_T$, the current rapidly increases as the selector 44 undergoes a transition from the nominally insulative state (off-state) to the nominally conductive state (on-state) characterized by a curve 102.

With continuing reference to FIG. 3, after the selector 44 of the magnetic memory cell 42 is turned on at or near $V_T$, the I-V response will follow a curve 104 with further increase in the cell voltage beyond $V_T$ when the magnetic memory element 46 is in the high resistance regime without switching the resistance state thereof. As the cell voltage decreases to near a holding voltage $V_{H1}$, the current decreases following the curve 104, while the selector 44 remains in the on-state (conductive state). At or near the holding voltage $V_{H1}$, the current rapidly decreases as characterized by a curve 106, indicating the transition of the selector 44 from the on-state (conductive state) back to the off-state (insulative state). Further decrease in the cell voltage beyond $V_{H1}$ causes the current to eventually reach zero at about 0 V while the selector 44 remains in the nominally insulative state as depicted by the curve 100. Accordingly, the selector 44 is a volatile switching device that requires the continuing application of a voltage to be conductive.

When the magnetic memory element 46 is in the low resistance regime, the I-V response of the magnetic memory cell 42 will follow a curve 108 after the selector 44 is turned on at or near $V_T$. With further increase in the cell voltage beyond $V_T$, the selector 44 will remain in the on-state as the current increases. As the cell voltage decreases to near another holding voltage $V_{H2}$, the current decreases following the curve 108, while the selector 44 remains in the nominally conductive state. At or near the holding voltage $V_{H2}$, the current rapidly decreases as characterized by a curve 110, indicating the transition of the selector 44 from the nominally conductive state back to the nominally insulative state. Further decrease in the cell voltage beyond $V_{H2}$ causes the current to eventually reach zero at about 0 V while the selector 44 remains in the nominally insulative state as depicted by the curve 100.

The polarity of the applied voltage to the magnetic memory cell 42 may be reversed. When the magnetic memory element 46 is in the high resistance regime, the I-V response may follow curves 100', 102', 104', 106', and back to curve 100' as the cell voltage increases from 0 V to a point beyond $V'_T$ and back. The insulative-to-conductive transition and the conductive-to-insulative transition occur at or near $V'_T$ and $V'_H$, respectively. When the magnetic memory element 46 is in the low resistance regime, the I-V response may follow curves 100', 102', 108', 110', and back to curve 100' as the cell voltage increases from 0 V to a point beyond V'$_T$ and back. The insulative-to-conductive transition and the conductive-to-insulative transition occur at or near V'$_T$ and V'$_{H2}$, respectively. Although FIG. 3 shows the I-V response plot of the memory cell 42 being substantially symmetric with respect to the current (vertical) axis, the present invention may be practiced even if the I-V response plot of the memory cell 42 is substantially asymmetric (i.e. |V$_T$|≠|V'$_T$| and/or |V$_{H1}$|≠|V'$_{H1}$| and/or |V$_{H2}$|≠|V'$_{H2}$|).

Figure 4:
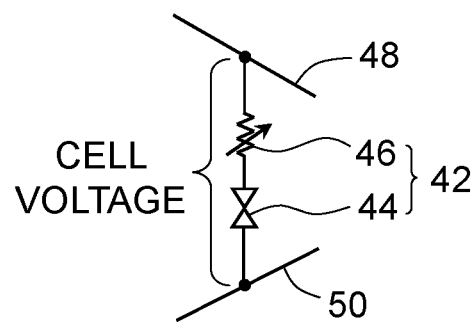
FIG. 4 is an I-V response plot illustrating switching behavior of a memory cell that includes a magnetic memory element and a selector coupled in series.
Figure 4:
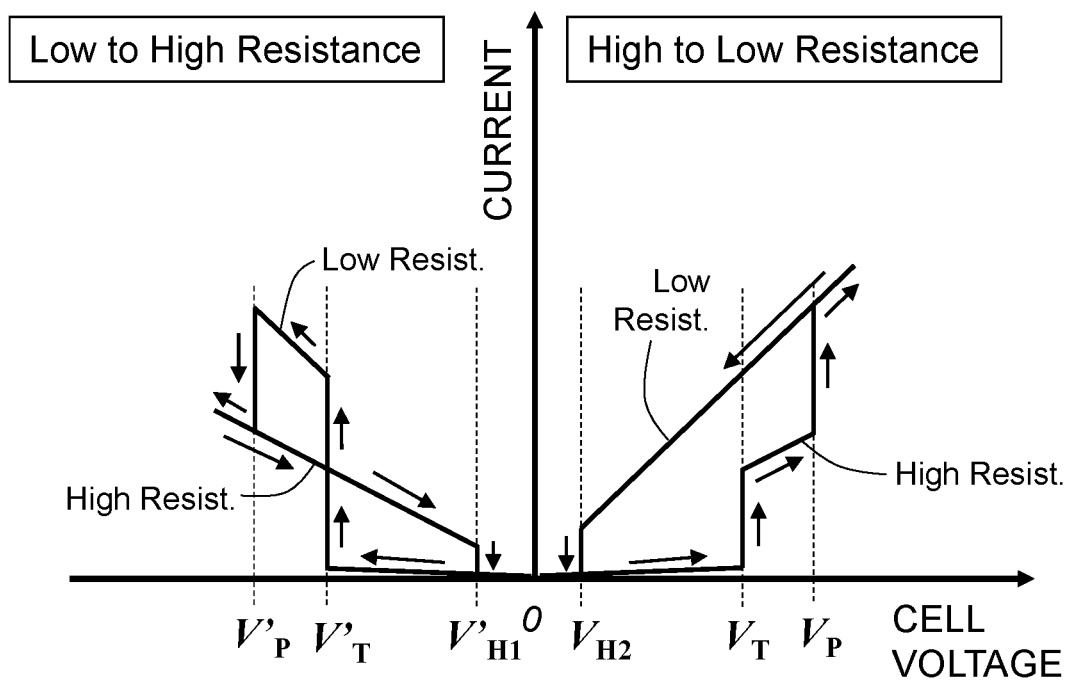

The I-V response plot in FIG. 4 illustrates the switching behavior of the magnetic memory element 46 of the memory cell 42. The magnetic memory element 46 may switch from the high to low resistance regime by applying a programming voltage of V$_P$ to the memory cell 42. Initially, the current may slightly increase as the cell voltage increases from zero to near the threshold voltage, V$_T$. At or near V$_T$, the current rapidly increases and exhibits a highly non-linear behavior, indicating a transition of the selector 44 from a nominally insulative or off state to a nominally conductive or on state. As the cell voltage continues to increase beyond V$_T$, the current increases and follows the high resistance curve, which may be mostly governed by the high resistance regime of the magnetic memory element 46, until reaching V$_P$, at which the magnetic memory element 46 switches the resistance state from the high to low resistance regime, thereby decreasing the cell resistance and increasing the current. As the cell voltage continues to increase beyond V$_P$, the current increases and follows the low resistance curve, which may be mainly governed by the low resistance regime of the magnetic memory element 46. As the cell voltage decreases from V$_P$ to near the holding voltage, V$_{H2}$, which is lower than V$_T$, the current decreases and follows the low resistance curve. At or near V$_{H2}$, the current rapidly decreases and exhibits a highly non-linear behavior, indicating a transition of the selector 44 from the nominally conductive state back to the nominally insulative state. As the cell voltage continues to decrease beyond V$_{H2}$, the current flow slightly decreases until stopping at about 0 V.

With continuing reference to FIG. 4, the magnetic memory element 46 may switch from the low to high resistance regime by applying a programming voltage of V'$_P$ with opposite polarity to the memory cell 42. Initially, the current may slightly increase as the cell voltage increases from zero to near the threshold voltage, V'$_T$. At or near V'$_T$, the current rapidly increases and exhibits a highly non-linear behavior, indicating a transition of the selector 44 from the nominally insulative or off state to the nominally conductive or on state. As the cell voltage continues to increase beyond V'$_T$, the current increases and follows the low resistance curve, which may be mostly governed by the low resistance regime of the magnetic memory element 46, until reaching V'$_P$, at which the magnetic memory element 46 switches the resistance state from the low to high resistance regime, thereby increasing the cell resistance and lowering the current. As the cell voltage continues to increase beyond V'$_P$, the current increases and follows the high resistance curve, which may be mainly governed by the high resistance regime of the magnetic memory element 46. As the cell voltage decreases from V'$_P$ to near a holding voltage, V'$_{H1}$, which is lower than V'$_T$, the current decreases and follows the high resistance curve. At or near V'$_{H1}$, the current rapidly decreases and exhibits a highly non-linear behavior, indicating a transition of the selector 44 from the nominally conductive state back to the nominally insulative state. As the cell voltage continues to decrease beyond V'$_{H1}$, the current flow slightly decreases until stopping at about 0 V.

Figure 1:
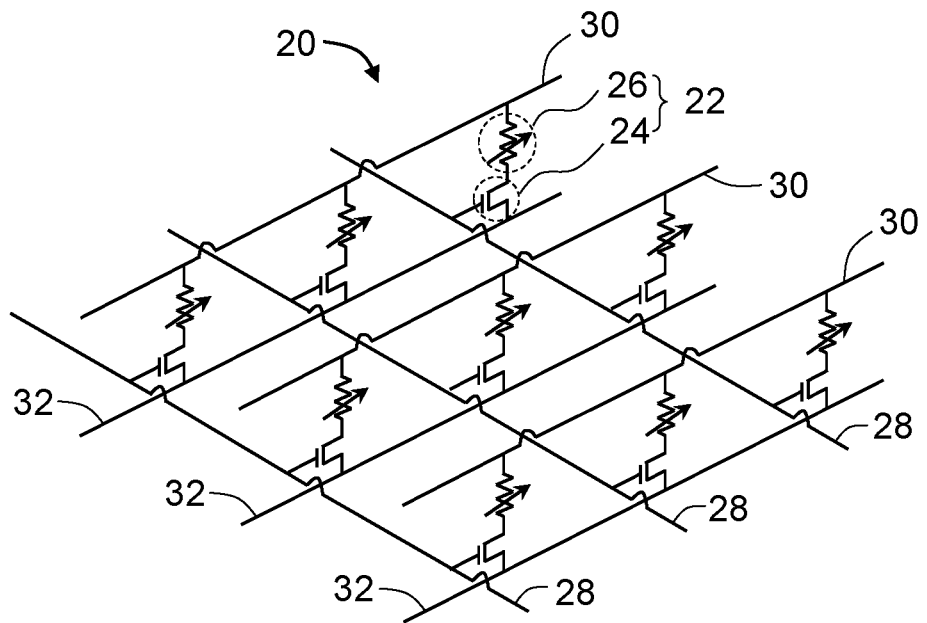
FIG. 1 is a circuit diagram illustrating an array of memory cells, each of which includes a memory element and a transistor coupled in series between two conductive lines.
Figure 2:
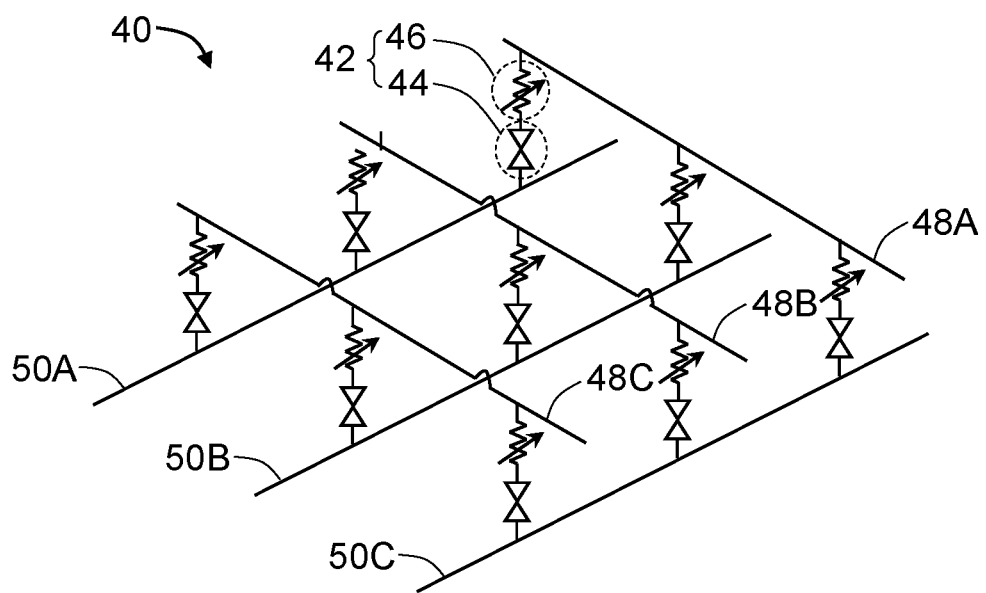
FIG. 2 is a circuit diagram illustrating an array of memory cells, each of which includes a memory element and a selector coupled in series between two conductive lines.
Figure 5:
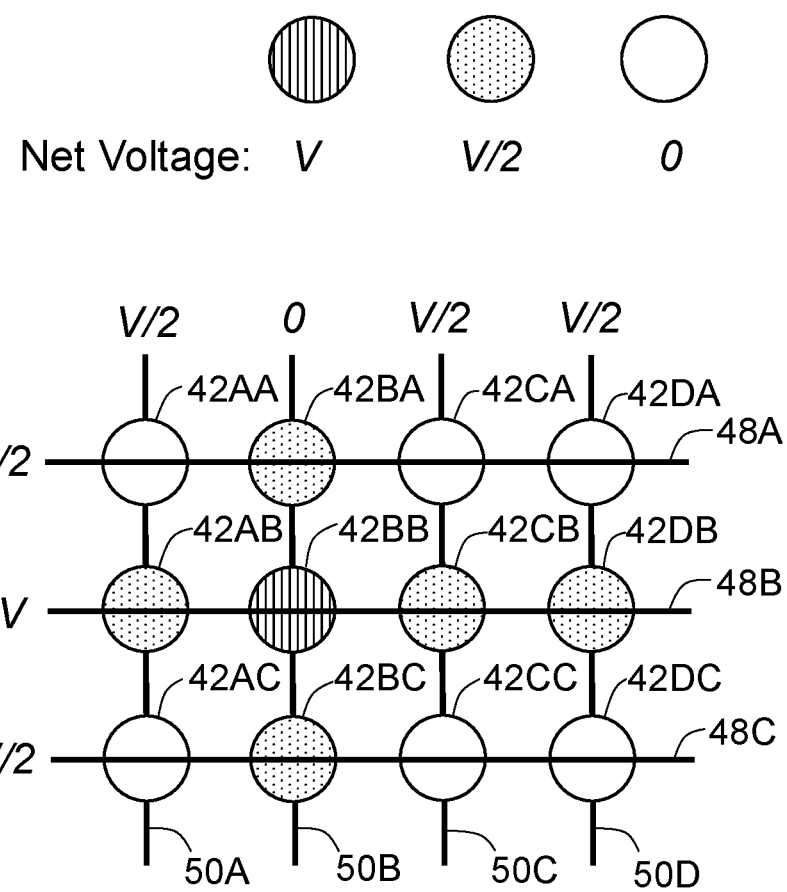
FIG. 5 illustrates a cell selection scheme for the memory array of FIG. 2.

FIG. 5 illustrates a scheme for selecting a memory cell 42 in the memory array 40 of FIG. 2 for sensing or programming by turning on the selector 44 of the cell 42. Referring now to FIG. 5, the memory cell 42BB is selected by applying a voltage, V, to one of the first conductive lines 48B coupled thereto, while grounding one of the second conductive lines 50B connected to the memory cell 42BB, thereby generating a potential difference of V across the memory cell 42BB. Meanwhile, to minimize current leakage and prevent accidental programming of the unselected memory cells, a voltage of about V/2 is applied to the unselected second conductive lines 50A, 50C-D, and the unselected first conductive lines 48A, 48C, resulting in a potential difference of V/2 across the unselected memory cells 42BA, 42AB, 42CB, 42DB, 42BC that are coupled to either the selected first conductive line 48B or the selected second conductive line 50B. The cell voltage of V is greater than or equal to V$_T$ to ensure that the selector of the selected memory cell 42BB becomes conductive, while the cell voltage of V/2 is not high enough for the selectors of the unselected memory cells 42BA, 42BC, 42AB, 42CB, and 42DB to become conductive. The rest of the unselected memory cells 42AA, 42CA, 42DA, 42AC, 42CC, and 42DC that are not connected to the selected first conductive line 48B or the selected second conductive line 50B experience essentially no potential drop thereacross.

In a write or programming operation, the applied voltage, V, may be greater than or equal to V$_P$ to turn on the selector 44 and to switch the resistance state of the magnetic memory element 46. In a read or sensing operation, the moment that the selector 44 turns on at or near V$_T$, however, the current through the memory cell 42 will spike, which can potentially cause accidental programming of the magnetic memory element 46 known as "read disturbance."

Figure 6:
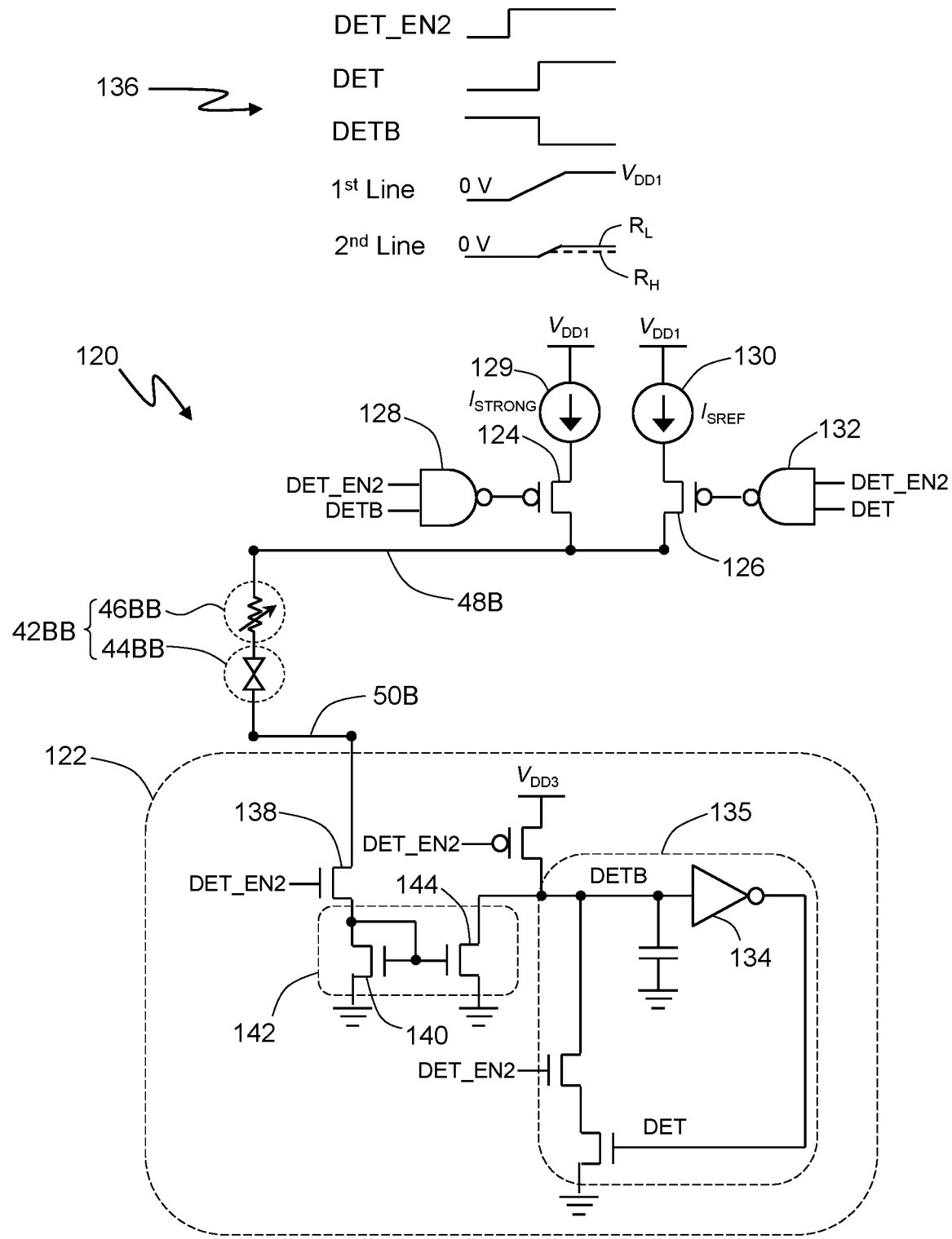
FIG. 6 illustrates an exemplary memory circuitry and a timing diagram for operating the circuitry in accordance with an embodiment of the present invention.

FIG. 6 is a schematic circuit diagram illustrating a memory circuitry 120 corresponding to an embodiment of the present invention that can minimize read disturbance when turning on the selected memory cell 42BB, which includes the magnetic memory element 46BB and the selector 44BB coupled in series between the selected first conductive line 48B and the selected second conductive line 50B. The relative positions of the magnetic memory element 46BB and the selector 44BB may be swapped such that the magnetic memory element 46BB and the selector 44BB are disposed adjacent to the second and first conductive lines 50B and 48B, respectively. The first and second conductive lines 48B and 50B may function as bit and word lines, respectively, or vice versa.

With continuing reference to FIG. 6, the second conductive line 50B further couples to a current detector 122 and the first conductive line 48B further couples to the drain of a first pull-up transistor 124 and the drain of a second pull-up transistor 126. The source of the first pull-up transistor 124 is at a potential of V$_{DD1}$ and the gate of the first pull-up transistor 124 is connected to the output of a first NAND gate 128, which has "DET_EN2" and "DETB" as input signals. The source of the first pull-up transistor 124 may be coupled to an optional current source 129. The source of the second pull-up transistor 126 is coupled to a current limiter 130, which may be in the form of a current source, at the potential of V$_{DD1}$ and the gate of the second pull-up transistor 126 is connected to the output of a second NAND gate 128, which has "DET_EN2" and "DET" as input signals. V$_{DD1}$ is greater than or equal to V$_T$ of the memory cell 42BB to turn on the selector 44B. The signals "DETB" and "DET" correspond to input and output of an inverter 134 in a latch circuit 135 of the current detector 122, respectively, and are therefore complementary to each other. The memory circuitry 120 may use other suitable designs of current detector without being limited the exemplary detector 122. Moreover, the current limiter 130 may alternatively be connected to the second conductive line 50B instead of the first conductive line 48B.

Operation of the memory circuitry 120 may be illustrated by an exemplary timing diagram 136 shown in FIG. 6. Assuming the first and second conductive lines 48B and 50B are initially at a voltage (e.g., 0 V or $V_{DD1}/2$) and the signals "DETB" and "DET" are initially at high (e.g., $V_{DD3}$) and low (e.g., 0 V), respectively, the process of turning on the selector 44BB begins by switching the signal "DET_EN2" from low to high, thereby turning on the first pull-up transistor 124 to increase the voltage of the first conductive line 48B while connecting the second conductive line 50B to ground via the current detector 122. The optional current source 129, if present, may prevent the first conductive line 48B from reaching $V_{DD1}$. When the potential drop across the memory cell 42BB reaches $V_T$, the selector 44B switches on and causes a current to flow through the memory cell 42BB, a third transistor 138 in the current detector 122, and a first transistor 140 of a current mirror circuit 142 in the current detector 122, thereby causing the voltage of the second conductive line 50B to increase. The voltage of the second conductive line 50B will be higher when the magnetic memory element 46BB is in the low resistance regime, and vice versa. As the current flows through the first transistor 140 of the current mirror circuit 142, another current also flows through a second transistor 144 of the current mirror circuit 142 that is coupled to the latch circuit 135, thereby switching the "DETB" signal in the latch circuit 135 from high to low and the complementary "DET" signal from low to high. As the "DETB" signal becomes low and the "DET" signal becomes high, the first pull-up transistor 124 switches off and the second pull-up transistor 126 switches on, thereby limiting the current flowing through the memory cell 42BB while maintaining the selector 44BB in the conductive state. The reduction of current flowing through the memory cell 42BB decreases the power consumption and minimize read disturbance. After the selector 44BB turns on, the operation may further proceed by continuously using the limited current flowing through the memory cell 42BB as a read or sensing current to determine the resistance state of the magnetic memory element 46BB. When the magnetic memory element 46BB is in the high resistance regime, the IR drop across the memory cell 42BB will be greater, resulting in a relatively lower voltage for the second conductive line 50B.

Figure 7:
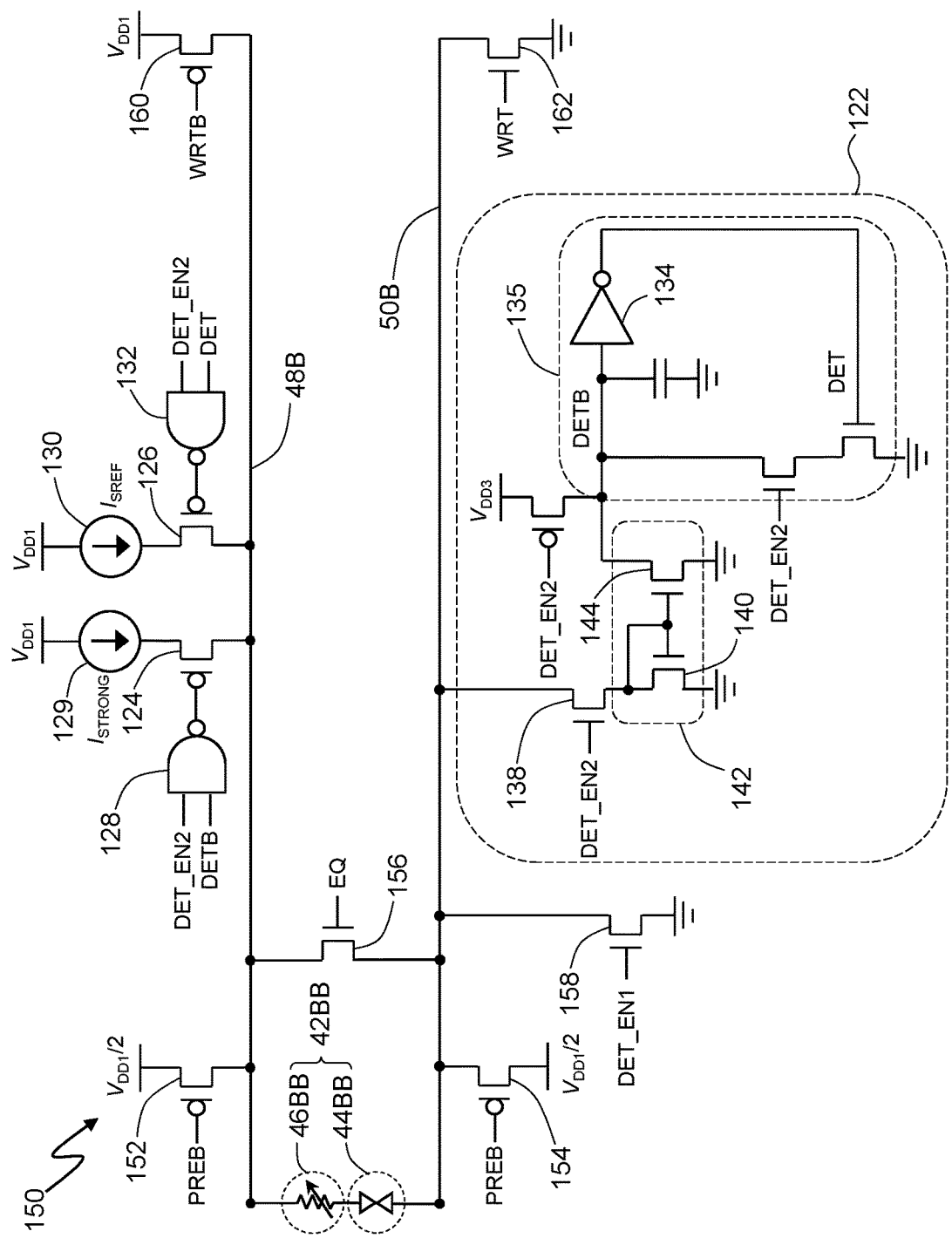
FIG. 7 is a circuit diagram for another exemplary memory circuitry in accordance with another embodiment of the present invention.

FIG. 7 is a schematic circuit diagram illustrating a memory circuitry 150 corresponding to another embodiment of the present invention. In the drawing, numerals 42-50 and 122-144 denote the same components as those shown in FIG. 6. Compared with the memory circuitry 120 shown in FIG. 6, the memory circuitry 150 further includes a fourth pull-up transistor 152 coupled to the first conductive line 48B for precharging the same 48B, a fifth pull-up transistor 154 coupled to the second conductive line 50B for precharging the same 50B, an optional connection between the first and second conductive lines 48B and 50B interposed by an optional sixth transistor 156, a seventh transistor 158 coupled to the second conductive line 50B for grounding the same 50B before the current detector 122 turns on, an eighth pull-up transistor 160 coupled to the first conductive line 48B and a corresponding ninth pull-down transistor 162 coupled to the second conductive line 50B for write operations.

The drains of the fourth and fifth pull-up transistors 152 and 154 are coupled to the first and second conductive lines 48B and 50B respectively, while the sources of the same transistors 152 and 154, which may provide the conductive lines 48B and 50B with a precharge voltage prior to turning on the selector 44B, may be at a potential of $V_{DD1}/2$. One of the source and drain of the seventh transistor 158 is coupled to the second conductive line 50B, while the other one of the source and drain of the seventh transistor 158 is grounded. The drain of the eighth pull-up transistors 160 is coupled to the first conductive line 48B, while the source of the same transistor 160 is at a voltage of $V_{DD1}$. The drain of the ninth transistor 162 is coupled to the second conductive line 50B, while the source of the same transistor 162 is grounded. The memory circuitry 150 may use other suitable designs of current detector without being limited the exemplary detector 122 shown. Moreover, the current limiter 130 may alternatively be connected to the second conductive line 50B instead of the first conductive line 48B.

Figure 8:
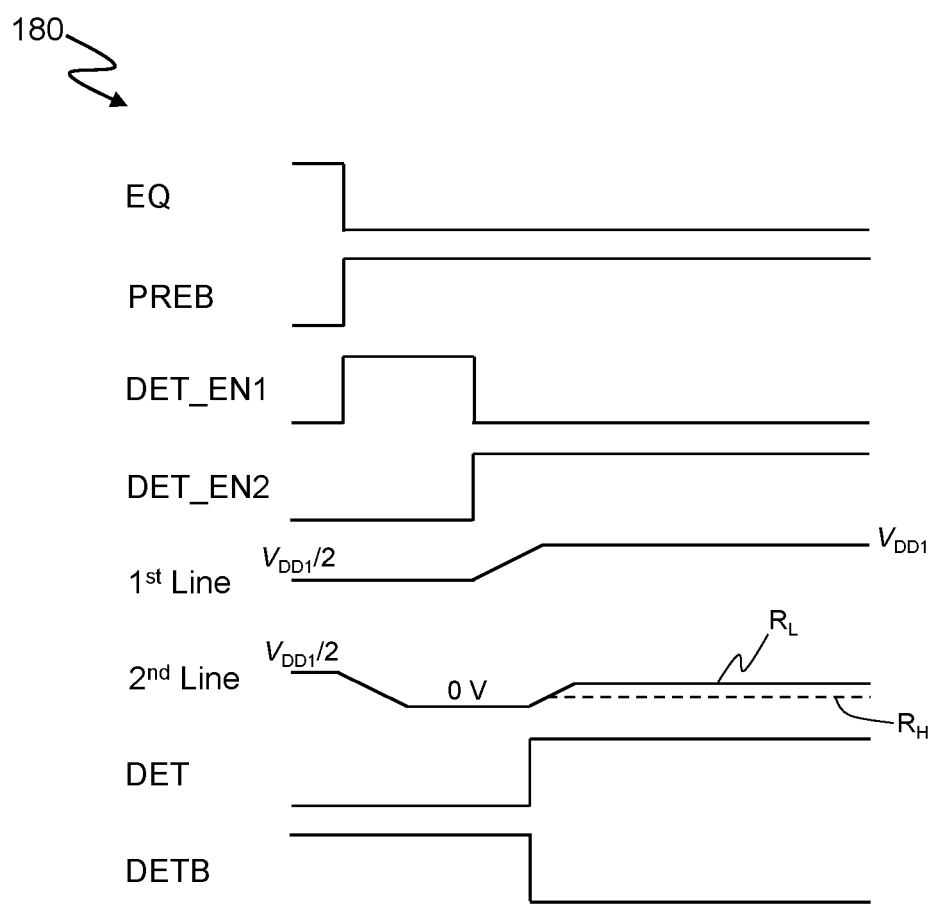
FIG. 8 is an exemplary timing diagram for operating the exemplary memory circuitry of FIG. 7.

The selector 44BB of the memory circuitry 150 may be operated in accordance with an exemplary timing diagram 180 shown in FIG. 8. Initially, the signals "DETB" and "DET" are at high (e.g., $V_{DD3}$) and low (e.g., 0 V), respectively, and the fourth and fifth pull-up transistors 152 and 154 are on to precharge the first and second conductive lines 48B and 50B, respectively, to a voltage of $V_{DD1}/2$, where $V_{DD1}/2 < V_T < V_{DD1}$. The process of turning on the selector 44BB begins by switching off the fourth and fifth pull-up transistors 152 and 154 via the signal "PREB" and switching on the seventh transistor 158 via the signal "DET_EN1" in order to ground the second conductive line 50B. After the voltage of the second conductive line 50B reaches 0 V, the seventh transistor 158 switches off, while the first pull-up transistor 124 and the third transistor 138 switch on via the signal "DET_EN2," thereby increasing the voltage of the first conductive line 48B toward $V_{DD1}$ while maintaining the voltage of the second conductive line 50B at approximately 0 V. The optional current source 129, if present, may prevent the first conductive line 48B from reaching $V_{DD1}$. When the potential drop across the memory cell 42BB reaches $V_T$, the selector 44B switches on and causes a current to flow through the memory cell 42BB, the third transistor 138 in the current detector 122, and the first transistor 140 of the current mirror circuit 142 in the current detector 122, thereby raising the voltage of the second conductive line 50B. The voltage of the second conductive line 50B will be higher when the magnetic memory element 46BB is in the low resistance regime, and vice versa. As the current flows through the first transistor 140 of the current mirror circuit 142, another current also flows through a second transistor 144 of the current mirror circuit 142 that is coupled to the latch circuit 135, thereby switching the "DETB" signal in the latch circuit 135 from high to low and the complementary "DET" signal from low to high. As the "DETB" signal becomes low and the "DET" signal becomes high, the first pull-up transistor 124 switches off and the second pull-up transistor 126 switches on, thereby limiting the current flowing through the memory cell 42BB. The reduction of current flowing through the memory cell 42BB decreases the power consumption and minimize read disturbance. After the selector 44BB turns on, the operation may further proceed by continuously using the limited current flowing through the memory cell 42BB as a read or sensing current to determine the resistance state of the magnetic memory element 46BB. When the magnetic memory element 46BB is in the high resistance regime, the IR drop across the memory cell 42BB will be greater, resulting in a relatively lower voltage for the second conductive line 50B.

Figure 9:
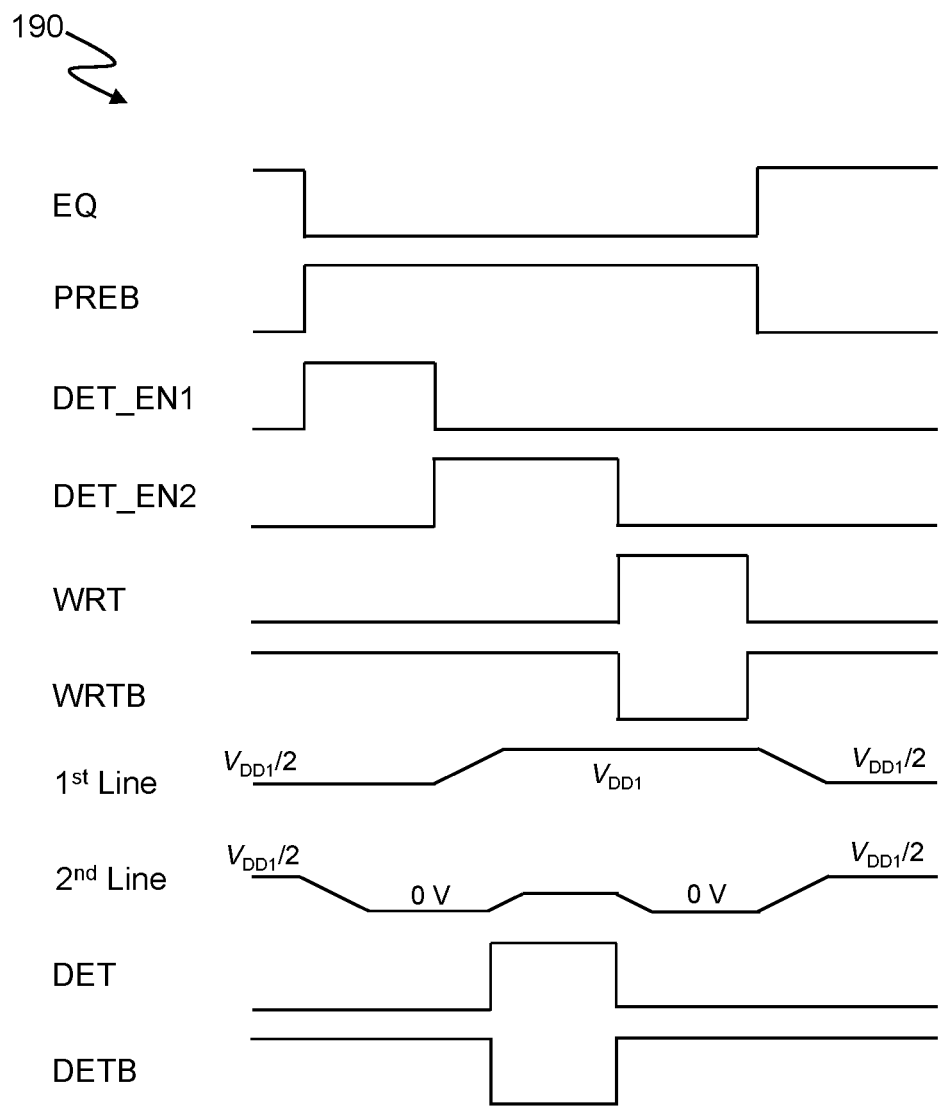
FIG. 9 is another exemplary timing diagram for operating the exemplary memory circuitry of FIG. 7.

The above described process corresponding to the timing diagram 180 of FIG. 8 may be used as a discrete sensing operation or an initial step for an integrated write operation in accordance with an embodiment of the present invention. The integrated write operation may begin by first sensing the resistance state of the magnetic memory element 46BB in accordance with the process illustrated by the timing diagram 180 to determine whether the magnetic memory element 46BB is already in the resistance regime to be written. If the magnetic memory element 46BB is already in the desired resistance regime (i.e., high or low), then the write operation terminates without actually switching the resistance state of the magnetic memory element 46BB. If, however, the magnetic memory element 46BB is not in the desired resistance regime, then the above described process illustrated by the timing diagram 180 continues by switching off the second pull-up transistor 126 and the current detector 122 via the "DET_EN2" signal and switching on the eighth pull-up transistor 160 and the ninth transistor 162 via the "WRTB" and "WRT" signals, respectively, as illustrated by the timing diagram 190 in FIG. 9. Since the current limiter 130 is disconnected from the first conductive line 48B, the switching current provided by the eighth pull-up transistor 160 will be significantly higher than the sensing current provided by the second pull-up transistor 126. After the writing step, the voltages of the first and second conductive lines 48B and 50B may return to the initial precharged state of $V_{DD1}/2$ by turning on the fourth and fifth pull-up transistors 152 and 154 via the "PREB" signal and by turning on the sixth transistor 156 via the signal "EQ".

It should be noted that the memory circuitry 150 in FIG. 7 may generate a write current that flows from the first conductive line 48B to the second conductive line 50B for switching the resistance state of the magnetic memory element 46BB. Sensing and write currents that flow the opposite direction, i.e., from the second conductive line 50B to the first conductive line 48B, may be similarly generated by reversing the connections of the components, as understood by those skilled in the art. Accordingly, in order to generate currents in both directions, the memory circuitry 150 may include two sets of the components 122-134, 138-144, and 158-162, with one set having the connections illustrated in FIG. 7 while the complementary set having opposite connections, i.e., the current detector 122 is connected to the first conductive line 48B and the second pull-up transistor 126 and the current limiter 130 are connected to the second conductive line 50B.

Figure 10:
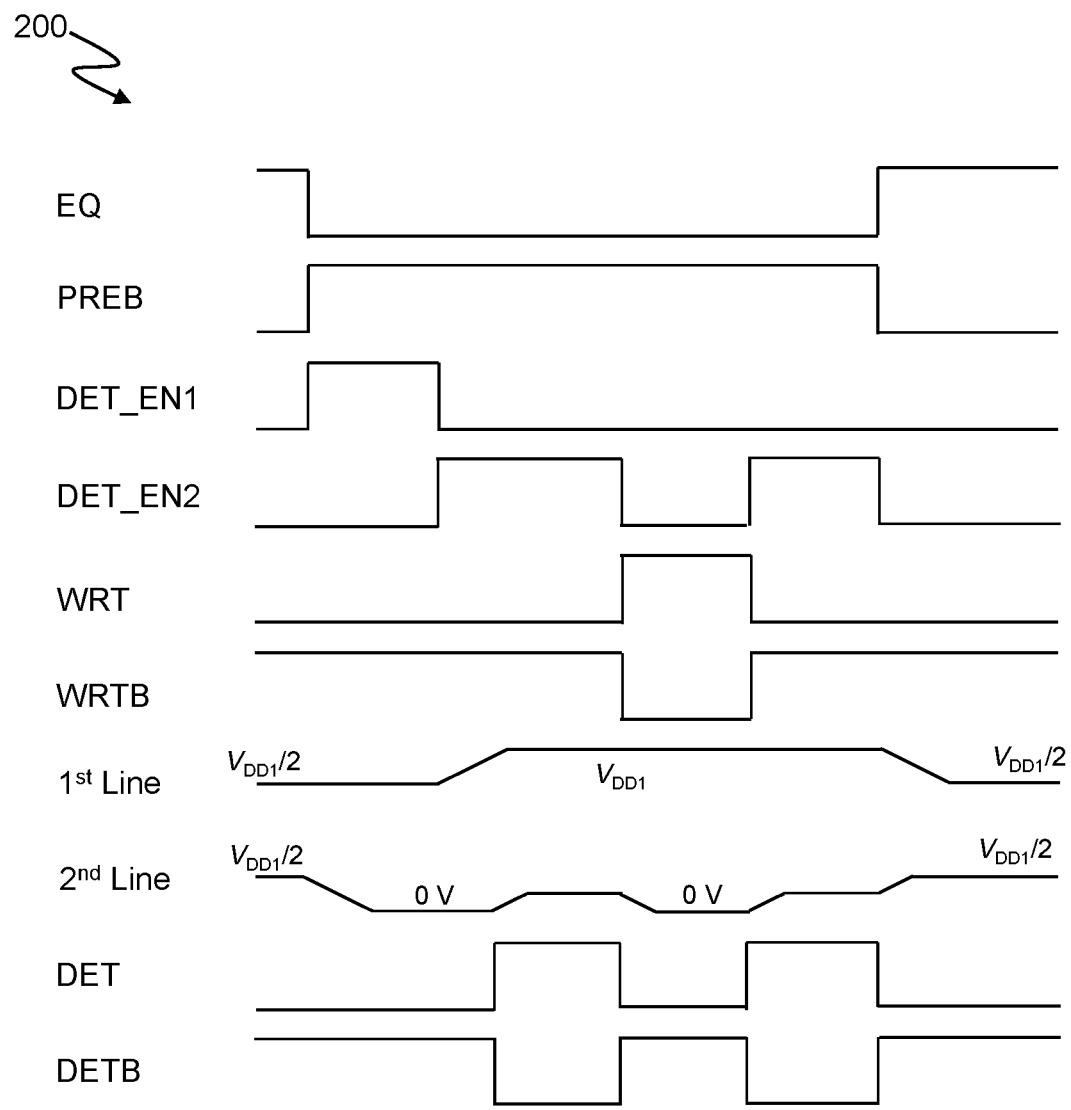
FIG. 10 is still another exemplary timing diagram for operating the exemplary memory circuitry of FIG. 7.

The integrated write operation as illustrated by the timing diagram 190 may further include a second sensing step for verifying the magnetic memory element 46BB is indeed in the desired resistance regime after the write step described above. After the write step is done, as illustrated by the timing diagram 200 in FIG. 10, the "DET_EN2" signal turns on the third transistor 138 in the current detector 122 and the first transistor 140 of the current mirror circuit 142 in the current detector 122, thereby causing the voltage of the second conductive line 50B to increase again. The "DET_EN2" signal also triggers the "DET" signal, which turns on the current limiter 130 to limit the current flowing through the memory cell 42BB. When the magnetic memory element 46BB is in the high resistance regime, the IR drop across the memory cell 42BB will be greater, resulting in a relatively lower voltage for the second conductive line 50B. After the second sensing step, the voltages of the first and second conductive lines 48B and 50B may return to the initial precharged state of $V_{DD1}/2$ by turning on the fourth and fifth pull-up transistors 152 and 154 via the "PREB" signal and by turning on the sixth transistor 156 via the signal "EQ". It should be noted that the voltage of the first conductive line 48B remains relatively constant throughout the first sensing step, the writing step, and the second sensing step as shown in the timing diagram 200. Therefore, all writing and sensing steps are carried out by essentially applying a single voltage pulse to the first conductive line 48B. As mentioned previously, the magnitude of the voltage pulse applied to the first conductive line 48B during the integrated write operation may be between $V_{DD1}$ and $V_{DD1}/2$, depending on the presence of the optional current limiter 129.

Figure 11:
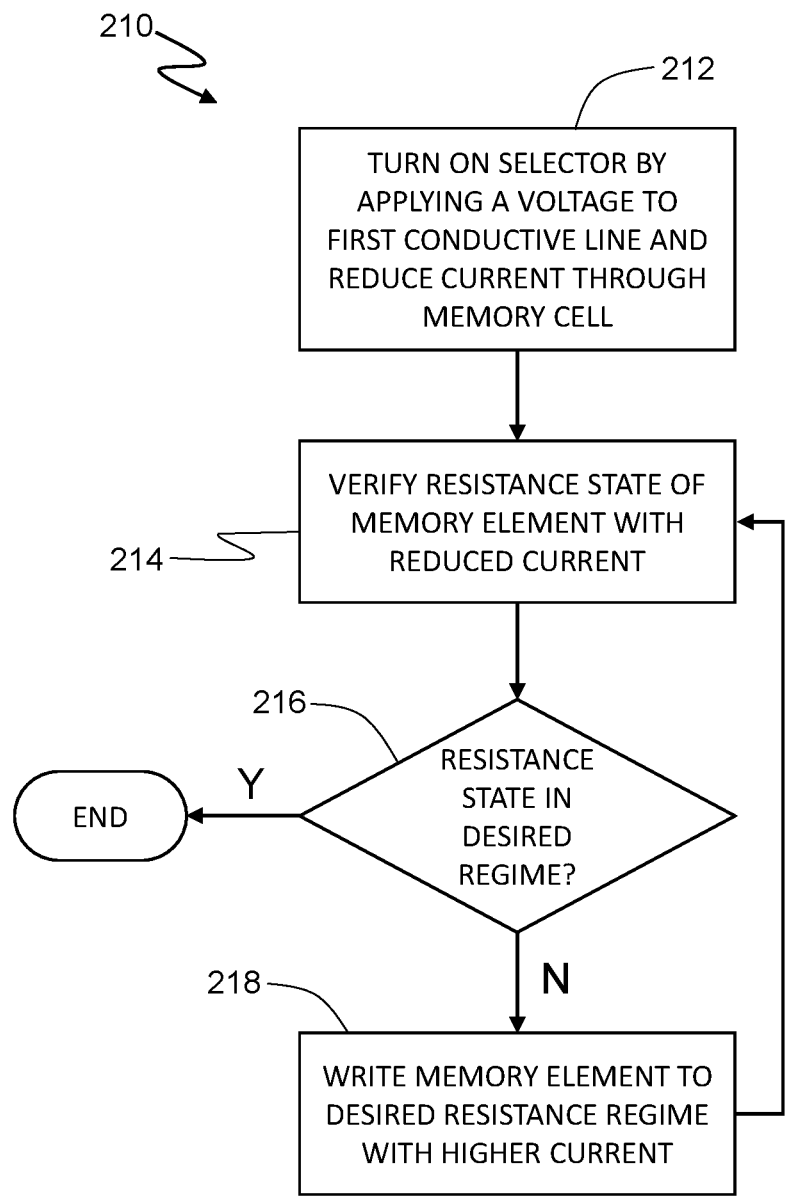
FIG. 11 is a flow chart illustrating the steps of integrated write operation in accordance with an embodiment of the present invention.

In the integrated write operation, the steps of write and verification can be repeated until the resistance state of the magnetic memory element 46BB is confirmed to be in the desired resistance regime (i.e., high or low) as illustrated by a flow chart of selected steps 210 in FIG. 11. The operating steps 210 begin at step 212 by turning on the selector 44BB and limiting the current flowing through the memory cell 42BB as described above and illustrated by the timing diagram 136 or 180. After the selector 44BB is turned on and the current is reduced at step 212, the resistance state of the memory element 46BB is sensed at step 214. After step 214, the process continues to step 216, where a decision is made as to whether the resistance state is in the desired regime (i.e., high or low). If so, the integrated write operation is done and terminated without actually having to switch the resistance state of the magnetic memory element 46BB. Otherwise, the process continues to step 218, where a switching current without being limited by the current limiter 130 flows through the memory cell 42BB to switch the resistance state of the magnetic memory element 46BB. After step 218, the process loops back to steps 214 and 216. The loop of steps 218, 214, and 216 may be repeated until the resistance state of the memory element 46BB is confirmed to be in the desired resistance regime.

Figure 12:
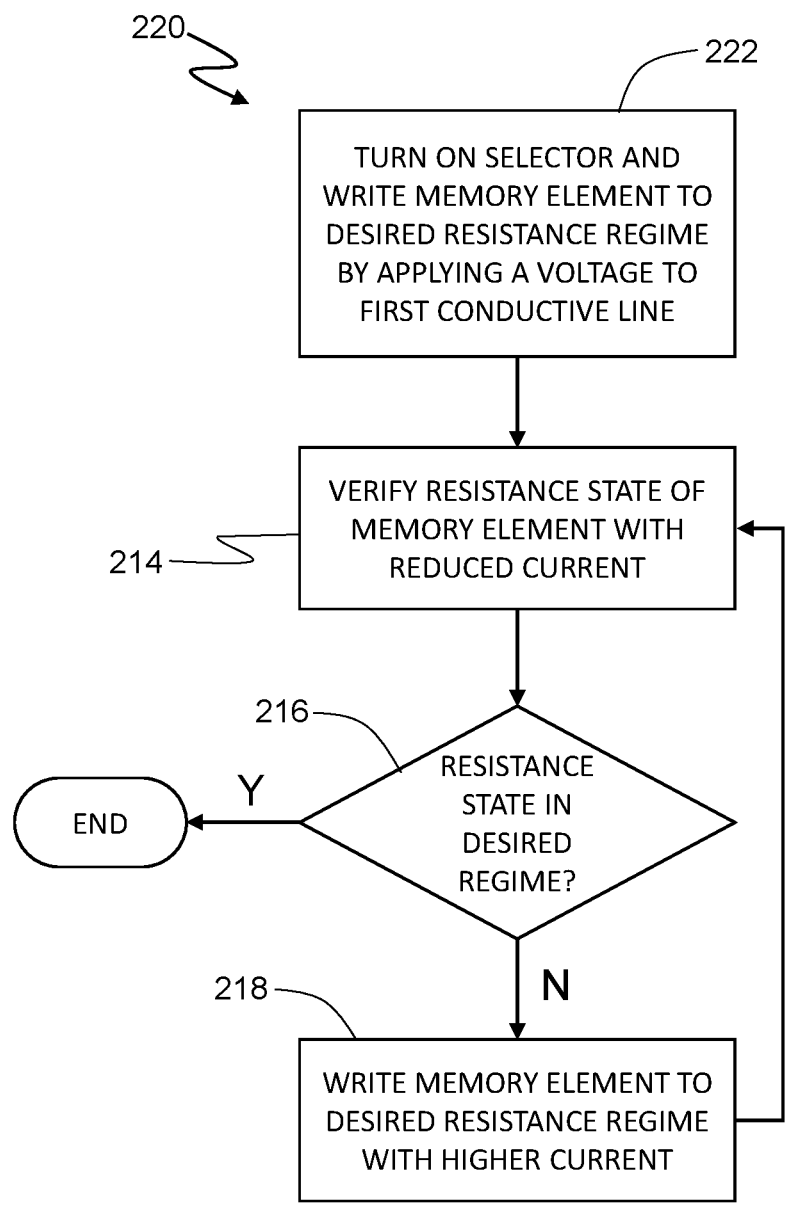
FIG. 12 is another flow chart illustrating the steps of integrated write operation in accordance with another embodiment of the present invention.

The integrated write operation may alternatively begin by turning on the selector 44BB and switching the resistance state of the magnetic memory element 46BB by switching on the eighth pull-up transistor 160 and the ninth transistor 162, thereby bypassing the current limiter 130, as illustrated by a flow chart of selected steps 220 in FIG. 12. After the initial step 222, the process moves to steps 214 and 216 as described above. The loop of steps 218, 214, and 216 may be repeated until the resistance state of the memory element 46BB is confirmed to be in the desired resistance regime.

The integrated write operation illustrated by the flow charts 210 and 220 may be carried out using other memory circuits without being limited to the exemplary circuits 120 and 150 illustrated in FIGS. 6 and 7, respectively.

The previously described embodiments of the present invention have many advantages, including low power consumption and minimal read disturbance. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A memory circuit including:
a magnetic memory element and a selector coupled in series between a first conductive line and a second conductive line;
a current detector coupled to the second conductive line; and
a means for supplying a sufficiently high voltage to the first conductive line for turning on the selector,
wherein when the selector turns on, the current detector detects a current flowing across the selector and effectuates a current limiter to reduce the current to prevent switching of the magnetic memory element while the selector remains on.

2. The memory circuit of claim 1, wherein the current detector includes a current mirror.

3. The memory circuit of claim 1, wherein the current detector includes a latch.

4. The memory circuit of claim 1, wherein the current limiter is coupled to the first conductive line.

5. The memory circuit of claim 1, wherein the current limiter is a current source.

6. The memory circuit of claim 1, wherein the magnetic memory element includes a magnetic reference layer and a magnetic free layer with an insulating tunnel junction layer interposed therebetween.

7. A method for operating a magnetic memory element and a selector coupled in series between a first conductive line and a second conductive line, the method comprising the steps of:
applying a sufficiently high voltage to the first conductive line for turning on the selector without switching the magnetic memory element;
reducing a current flowing through the selector to further prevent switching of the magnetic memory element while maintaining the selector on; and
determining a resistance state of the magnetic memory element after reducing the current,
wherein the selector is a volatile threshold-switching device.

8. The method of claim 7, wherein the magnetic memory element includes a magnetic reference layer and a magnetic free layer with an insulating tunnel junction layer interposed therebetween.

9. The method of claim 7, wherein the step of determining the resistance state of the magnetic memory element is carried out by measuring a voltage of the second conductive line.

10. The method of claim 7, wherein the step of reducing the current flowing through the selector is accomplished by a current limiter.

11. The method of claim 10, wherein the current limiter is a current source.

12. The method of claim 7 further comprising the step of switching the resistance state of the magnetic memory element by maintaining the sufficiently high voltage on the first conductive line without limiting the current after determining the resistance state of the magnetic memory element.

13. The method of claim 12 further comprising the steps of reducing the current flowing through the selector and determining the resistance state of the magnetic memory element after switching the resistance state of the magnetic memory element.

14. The memory circuit of claim 1, wherein the selector is a volatile threshold-switching device.

* * * * *